(12) United States Patent
Dolmans

(10) Patent No.: US 8,183,955 B2
(45) Date of Patent: May 22, 2012

(54) CIRCUIT COMPRISING TRANSMISSION LINES

(75) Inventor: Wilhelmus M. C. Dolmans, Son (NL)

(73) Assignee: NXP B.V., Eindhoven (NL)

( * ) Notice: Subject to any disclaimer, the term of this patent is extended or adjusted under 35 U.S.C. 154(b) by 136 days.

(21) Appl. No.: 12/307,362

(22) PCT Filed: Jul. 3, 2007

(86) PCT No.: PCT/IB2007/052597
§ 371 (c)(1),
(2), (4) Date: Jan. 4, 2009

(87) PCT Pub. No.: WO2008/007303
PCT Pub. Date: Jan. 17, 2008

(65) Prior Publication Data
US 2009/0284333 A1 Nov. 19, 2009

(30) Foreign Application Priority Data
Jul. 7, 2006 (EP) .................... 06116821

(51) Int. Cl.
*H03H 7/38* (2006.01)
(52) U.S. Cl. ............................ 333/34; 333/33
(58) Field of Classification Search .................... 333/34, 333/33, 246
See application file for complete search history.

(56) References Cited

U.S. PATENT DOCUMENTS

| 4,786,883 A | 11/1988 | Spinner |
| 6,737,931 B2 | 5/2004 | Amparan et al. |
| 6,856,210 B2 | 2/2005 | Zhu et al. |
| 7,183,873 B1* | 2/2007 | Schwendinger et al. ........ 333/34 |
| 2001/0054939 A1* | 12/2001 | Zhu et al. ...................... 333/33 |
| 2004/0104044 A1 | 6/2004 | Wu |

FOREIGN PATENT DOCUMENTS

| EP | 0255198 A1 | 2/1988 |
| EP | 1376749 A | 1/2004 |
| WO | 2004047169 A1 | 6/2004 |

OTHER PUBLICATIONS

Shirasaki H. Design Charts by Waveguide Model and Mode-Matching Techniques of Microstrip Line Taper Shapes for Satellite Broadcast Planar Antenna. Jul. 16, 2000, Antennas and Propagation Society International Symposium, 2000. IEEE Jul. 16-21, 2000, XP010514942; ISBN: 0-7803-6369-8.

* cited by examiner

*Primary Examiner* — Stephen Jones

(57) ABSTRACT

In a circuit (1) comprising first and second transmission lines (11,12) with first and second line widths, the transmission lines (11,12) are coupled to each other via a coupling (13,14) with first and second coupling widths at its ends, such that a smaller one of the line widths and a larger one of the coupling widths are combined, and such that a larger one of the line widths and a smaller one of the coupling widths are combined. Such a coupling (13,14) introduces relatively small reflection coefficients, for example for distances between ends of the transmission lines (11,12) smaller than a wavelength of frequency signals to be exchanged via the transmission lines (11,12) and the coupling (13,14). The circuit (1) can then become more compact. The coupling (13,14) may comprise one single taper or may comprise a first taper (13) with a first, larger coupling width and a second taper (14) with a second, smaller coupling width.

20 Claims, 3 Drawing Sheets

CIRCUIT COMPRISING TRANSMISSION LINES

FIELD OF THE INVENTION

The invention relates to a circuit comprising transmission lines, and also relates to a device, and to a method.

Examples of such a circuit are integrated circuits and printed circuit boards. Examples of such a device are consumer products and non-consumer products.

BACKGROUND OF THE INVENTION

US 2004/0104044 A1 discloses a printed circuit board design. To electrically interconnect two transmission lines situated in different layers of the printed circuit board, copper foils imprinted on the sidewalls of the printed circuit board are used. In case the transmission lines have equal line widths, the copper foil has a rectangular shape. In case the transmission lines do not have equal line widths, one end of the copper foil connected to a broadest transmission line has a foil width equal to a line width of this broadest transmission line, and the other end of the copper foil connected to a narrowest transmission line has a foil width equal to a line width of this narrowest transmission line.

To electrically interconnect different transmission lines having different line widths and situated in a same layer, a so-called taper is to be used. This taper interconnects the transmission lines, preferably such that a largest part of radio frequency signals can pass the taper and only a smallest part of these radio frequency signals is reflected. A reflection coefficient of the taper defines which part is reflected. The reflection coefficient for example depends on the fact that the transmission lines, when having different line widths, will have different impedances. To keep this reflection coefficient as small as possible, one end of the taper connected to a broadest transmission line may have a taper width equal to a line width of this broadest transmission line, and the other end of the taper connected to a narrowest transmission line may have a taper width equal to a line width of this narrowest transmission line. From the one end to the other end of the taper, the taper width may gradually change, for example linearly or exponentially.

The reflection coefficient further depends on a distance between ends of the transmission lines. As long as this distance is larger than 20% of a wavelength of the frequency signals to be exchanged via the transmission lines, the reflection coefficient is relatively small. But for shorter distances, this reflection coefficient becomes relatively large.

SUMMARY OF THE INVENTION

It is an object of the invention, inter alia, to provide a circuit comprising different transmission lines having different line widths, which transmission lines are coupled to each other without a relatively large reflection coefficient being introduced, especially (but not exclusively) in case a distance between ends of the transmission lines is smaller than a wavelength of frequency signals to be exchanged via the transmission lines.

Further objects of the invention are, inter alia, to provide a device comprising a circuit, and to provide a method for coupling transmission lines.

The circuit according to the invention comprises:
a first transmission line with a first line width,
a second transmission line with a second line width, and
a coupling with a first coupling width at one end and with a second coupling width at the other end, the one end being coupled to the first transmission line and the other end being coupled to the second transmission line, which first line width is smaller than the second line width, which first coupling width is larger than the first line width and which second coupling width is smaller than the second line width.

By using this coupling for interconnecting the transmission lines, the transmission lines are coupled to each other without a relatively large reflection coefficient being introduced. Especially in case a distance between ends of the transmission lines is smaller than a wavelength of frequency signals to be exchanged via the transmission lines, such as a distance of 10%, 5% or 1% of the wavelength, this coupling has proven to perform well. However, for distances larger than this wavelength, the coupling might be used as well.

The circuit according to the invention is further advantageous, inter alia, in that it can be more compact, owing to the fact that the distance between the ends of the transmission lines can be smaller.

An embodiment of the circuit according to the invention is defined by a difference between the first line width and the second coupling width being smaller than a difference between the first line width and the second line width, and a difference between the second line width and the first coupling width being smaller than the difference between the first line width and the second line width. According to this embodiment, the first line width and the second coupling width differ less from each other than the difference between the first line width and the second line width. And the second line width and the first coupling width differ less from each other than the difference between the first line width and the second line width.

An embodiment of the circuit according to the invention is defined by the first coupling width being 80-120% of the second line width and the second coupling width being 80-120% of the first line width. According to this embodiment, the first coupling width and the second line width are substantially identical, and the second coupling width and the first line width are substantially identical.

An embodiment of the circuit according to the invention is defined by the first transmission line and the coupling and the second transmission line forming a serial arrangement for guiding frequency signals. In such a serial arrangement, the frequency signals are exchanged from the first transmission line via the coupling to the second transmission line and/or vice versa.

An embodiment of the circuit according to the invention is defined by a length of the coupling being smaller than a wavelength of the frequency signals. Shorter couplings allow the circuit to be more compact. However, for couplings having a length larger than this wavelength, the invention might be used as well.

An embodiment of the circuit according to the invention is defined by a length of the first transmission line and a length of the second transmission line being larger than 5% of the wavelength of the frequency signals. A transmission line has a predefined impedance defined by its line width and by its material characteristics only if its length is larger than 5% of the wavelength of the frequency signals. Owing to the fact that the reflection coefficient of the coupling directly results from the mismatches between the coupling and the transmission lines, for the transmission lines having a length larger than 5% of the wavelength of the frequency signals, there is a predefined situation. However, for one or more of the transmission lines having a length shorter than 5% of the wavelength of the frequency signals, the coupling might be used as well.

An embodiment of the circuit according to the invention is defined by the coupling comprising:

at its one end, a first taper with the first coupling width, and at its other end, a second taper with the second coupling width, the second taper being coupled to the first taper, the first taper and the second taper forming a further serial arrangement for guiding frequency signals.

According to this embodiment, the coupling is realized by interconnecting two tapers to each other. This is a simple realization, especially in case the first coupling width and the second line width are relatively identical and in case the second coupling width and the first line width are relatively identical. The tapers are for example block tapers. Three or more tapers in a coupling are not to be excluded.

An embodiment of the circuit according to the invention is defined by a length of the first taper and/or a length of the second taper being 40-60% of a length of the coupling. According to this embodiment, the length of the first taper is for example 40% and the length of the second taper is for example 60% of the length of the coupling, or vice versa. Preferably, the length of each taper will be 50% of the length of the coupling.

Embodiments of the device according to the invention and of the method according to the invention correspond with the embodiments of the circuit according to the invention. The invention is based upon an insight, inter alia, that a reflection coefficient of a coupling depends on the length of this coupling which corresponds to a distance between the ends of the transmission lines that are to be coupled, and that this reflection coefficient becomes relatively large for lengths and/or distances smaller than 20% of a wavelength of the frequency signals to be exchanged via the transmission lines, and is based upon a basic idea, inter alia, that the coupling should have a first coupling width at the end of the first transmission line and should have a second coupling width at the end of the second transmission line, which first coupling width should be larger than the first line width of the first transmission line and which second coupling width should be smaller than the second line width of the second transmission line.

The invention solves the problem, inter alia, to provide a circuit comprising different transmission lines having different line widths, which transmission lines are coupled to each other without a relatively large reflection coefficient being introduced, especially in case a distance between ends of the transmission lines is smaller than a wavelength of frequency signals to be exchanged via the transmission lines. The circuit according to the invention is further advantageous, inter alia, in that it can be more compact, owing to the fact that the distance between the ends of the transmission lines can be smaller.

These and other aspects of the invention will be apparent from and elucidated with reference to the embodiments(s) described hereinafter.

DETAILED DESCRIPTION OF EMBODIMENTS

Figure 1:
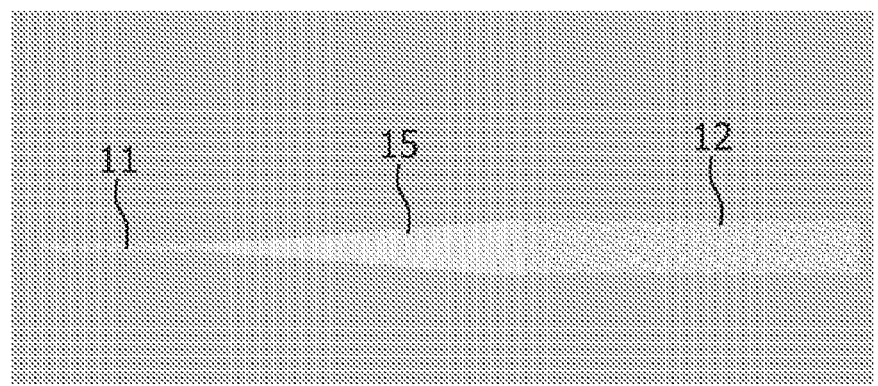
FIG. 1 shows diagrammatically a prior art circuit.

The circuit shown in the FIG. 1 comprises a first transmission line 11 and a second transmission line 12 coupled to each other via a taper 15.

Figure 2:
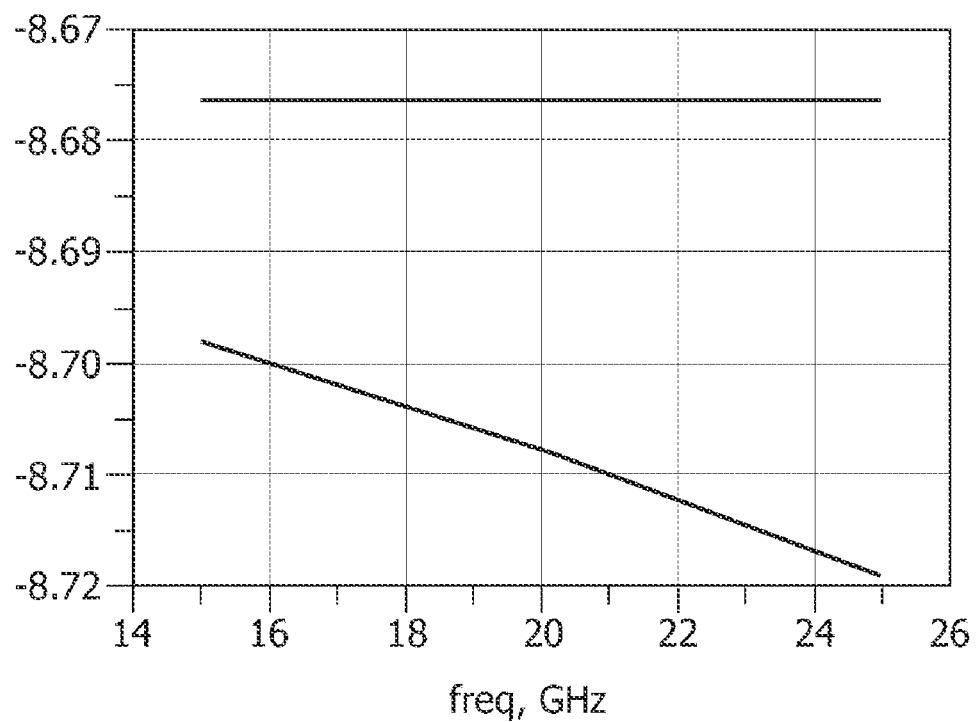
FIG. 2 shows a loss in dB versus frequency in GHz for the circuit of the FIG. 1.
Figure 3A:
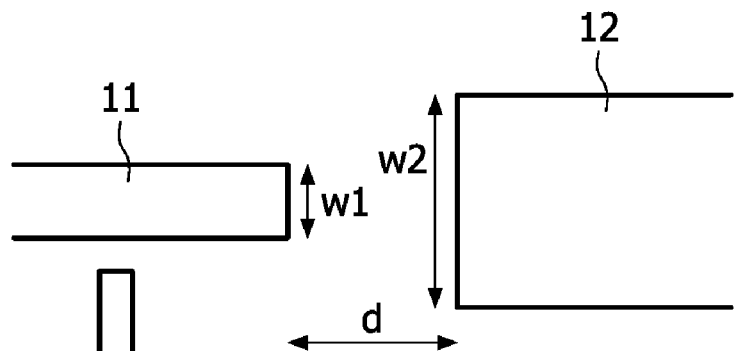
FIG. 3 shows diagrammatically the coupling of two transmission lines according to the invention.
Figure 3B:
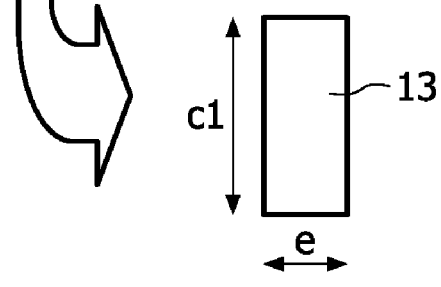
Figure 3C:
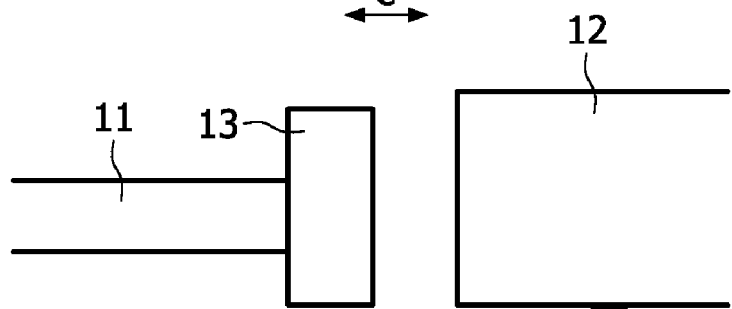
Figure 3D:
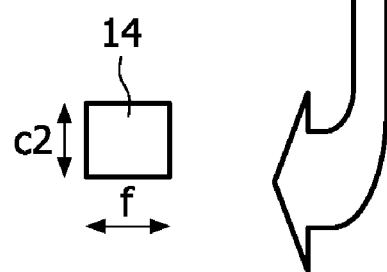
Figure 3E:
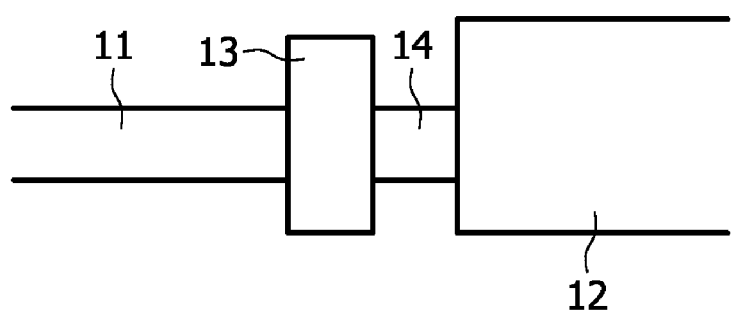

In the FIG. 2, a loss in dB versus frequency in GHz is shown for the circuit of the FIG. 1. An upper graph defines a loss of about 8.67 dB for a situation whereby the two transmission lines 11 and 12 are coupled directly to each other, without the taper 15 being in between. A lower graph defines a loss of about 8.698 dB at 15 GHz to about 8.719 dB at 25 GHz for the circuit 1 comprising the taper 15. So, compared to the direct connection, the taper 15 reduces a loss of the circuit in dB. However, for distances between ends of the transmission lines 11 and 12 smaller than 20% of a wavelength of frequency signals to be exchanged via the transmission lines 11 and 12, a reflection coefficient of the taper 15 becomes relatively large, and losses will increase.

In the FIG. 3, the coupling of the two transmission lines 11 and 12 is shown. In FIG. 3A, the two transmission lines 11 and 12 are shown, a first transmission line 11 has a line width w1 and a second transmission line 12 has a line width w2. A distance d is present between ends of the transmission lines 11 and 12. In the FIG. 3B, a first block taper 13 with a width c1 and with a length e is constructed. The width c1 is for example equal to the line width w2 and the length e is for example equal to half the distance d, without excluding other options. In the FIG. 3C, the first block taper 13 is connected to the first transmission line 11 that has the shortest width w1 of both transmission lines 11 and 12. In the FIG. 3D, a second block taper 14 with a width c2 and a length f is constructed. The width c2 is for example equal to the line width w1 and the length f is for example equal to half the distance d, without excluding other options. In the FIG. 3E, the second block taper 14 is connected to the first block taper 13 and to the second transmission line 12 that has the largest width w2 of both transmission lines 11 and 12.

Figure 4:
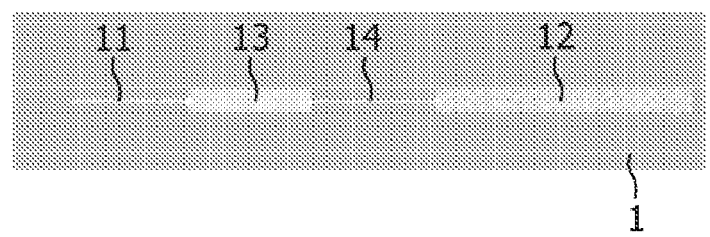
FIG. 4 shows diagrammatically a circuit according to the invention.

The circuit 1 according to the invention shown in the FIG. 4 comprises the first transmission line 11 and the second transmission line 12 coupled to each other via a coupling 13,14. This coupling 13,14 for example comprises the first (block) taper 13 and the second (block) taper 14, without excluding other options for realizing the coupling 13,14 that, in a first situation, has a first coupling width c1 at one end and with a second coupling width c2 at the other end, the one end being coupled to the first transmission line 11 and the other end being coupled to the second transmission line 12, which first line width w1 is smaller than the second line width w2, which first coupling width c1 is larger than the first line width w1 and which second coupling width c2 is smaller than the second line width w2.

In a second situation, a difference between the first line width w1 and the second coupling width c2 is smaller than a difference between the first line width w1 and the second line width w2, and a difference between the second line width w2 and the first coupling width c1 is smaller than the difference between the first line width w1 and the second line width w2.

In a third situation, the first coupling width c1 is about 80-120% of the second line width w2 and the second coupling width c2 is about 80-120% of the first line width w1.

The first transmission line 11 and the coupling 13,14 and the second transmission line 12 form a serial arrangement for guiding frequency signals. The first taper 13 and the second taper 14 form a further serial arrangement that is a part of the serial arrangement for guiding the frequency signals.

Figure 5:
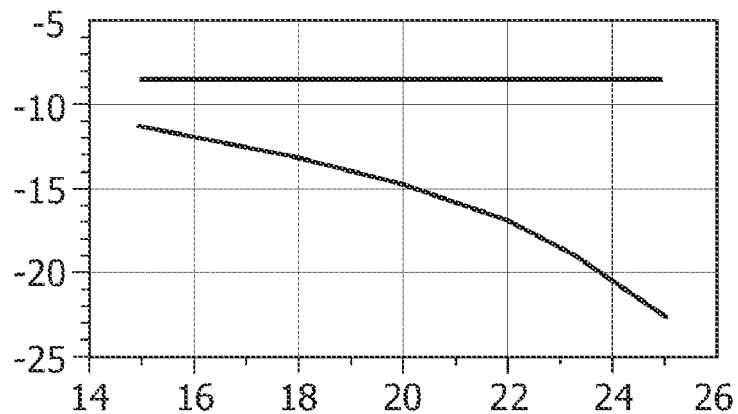
FIG. 5 shows a loss in dB versus frequency in GHz for the circuit of the FIG. 4.

In the FIG. 5, a loss in dB versus frequency in GHz is shown for the circuit of the FIG. 4. An upper graph defines a loss of about 8.67 dB for a situation whereby the two transmission lines 11 and 12 are coupled directly to each other, without the coupling 13,14 being in between. A lower graph defines a loss of about 11.5 dB at 15 GHz to about 22.5 dB at 25 GHz for the circuit 1 comprising the coupling 13,14. So, compared to the direct connection, the coupling 13,14 reduces a loss of the circuit in dB. Compared to the taper 15 shown in the FIG. 1, the coupling 13,14 also reduces a loss of the circuit, at least for lengths d (=e+f) of the coupling 13,14 smaller than a wavelength of the frequency signals, such as lengths equal to 1% to 20% of this wavelength, for example lengths equal to 2% or 5% or 10% of this wavelength.

Generally, lengths of the first and second transmission lines 11 and 12 will be larger than 5% of the wavelength of the frequency signals. Otherwise the transmission lines 11 and 12 do not have their predefined impedances defined by the line width and by the material characteristics. The reflection coefficient of the coupling 13,14 directly results from the mismatches between the coupling 13,14 and the transmission lines 11 and 12. Further, a length e of the first taper 13 and/or a length f of the second taper 14 will be situated in an interval of 40-60% of the length d of the coupling 13,14, whereby a sum of the lengths e and f will be equal to the length d.

Figure 6:
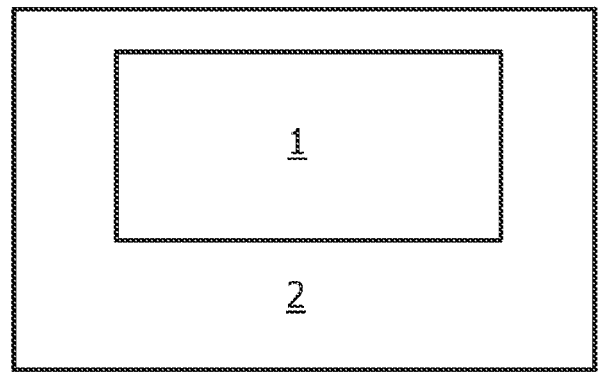
FIG. 6 shows diagrammatically a device according to the invention comprising a circuit according to the invention.

FIG. 6 shows diagrammatically a device 2 according to the invention comprising a circuit 1 according to the invention. The circuit 1 for example is an integrated circuit or a printed circuit board. The device 2 for example is a consumer product or a non-consumer product.

Instead of realizing the coupling 13,14 via the tapers 13 and 14, further realizations are not to be excluded, such as for example realizing the coupling 13,14 through one single taper having a form of a combination of the tapers 13 and 14, and such as for example realizing the coupling through the taper 15 shown in the FIG. 1, whereby the ends of the taper 15 have traded places such that the broader end of the taper 15 is coupled to the narrower transmission line 11 and such that the narrower end of the taper 15 is coupled to the broader transmission line 12. A coupling may comprise three or more tapers. At the moment, an application might be situated between 1 MHz and 1000 GHz.

Summarizing, in a circuit 1 comprising first and second transmission lines 11,12 with first and second line widths, the transmission lines 11,12 are coupled to each other via a coupling 13,14 with first and second coupling widths at its ends, such that a smaller one of the line widths and a larger one of the coupling widths are combined, and such that a larger one of the line widths and a smaller one of the coupling widths are combined. Such a coupling 13,14 introduces relatively small reflection coefficients, for example for distances between ends of the transmission lines 11,12 smaller than a wavelength of frequency signals to be exchanged via the transmission lines 11,12 and the coupling 13,14. The circuit 1 can then become more compact. The coupling 13,14 may comprise one single taper or may comprise a first taper 13 with a first, larger coupling width and a second taper 14 with a second, smaller coupling width.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit comprising:
a first transmission line with a first line width,
a second transmission line with a second line width, and
a coupling including one or more tapers coupled in series with a first coupling width at one end of the coupling and with a second coupling width at the other end of the coupling, the one end being coupled to the first transmission line and the other end being coupled to the second transmission line, which first line width is smaller than the second line width, which first coupling width is larger than the first line width and which second coupling width is smaller than the second line width, the coupling configured to guide frequency signals and having a length less than the frequency signals.

2. The circuit as defined by the claim 1, a difference between the first line width and the second coupling width being smaller than a difference between the first line width and the second line width, and a difference between the second line width and the first coupling width being smaller than the difference between the first line width and the second line width.

3. The circuit as defined by the claim 1, the first coupling width being 80-120% of the second line width and the second coupling width being 80-120% of the first line width.

4. A device comprising the circuit as defined by the claim 1.

5. The circuit as defined by the claim 1, wherein the length of the coupling is smaller than 20% of a wavelength of the frequency signals.

6. The circuit as defined by the claim 1, wherein the coupling includes two tapers coupled in series.

7. The circuit as defined by the claim 1, wherein the coupling includes at least three tapers coupled in series.

8. The circuit as defined by the claim 1, wherein the first transmission line, second transmission line, and coupling are located in the same plane.

9. The circuit as defined by the claim 1, wherein a length of the first transmission line and a length of the second transmission line are each larger than 5% of the wavelength of the frequency signals, and wherein the first transmission line, second transmission line, and coupling are located in the same plane.

10. The circuit as defined by the claim 1, wherein a length of the first transmission line and a length of the second transmission line are each larger than 5% of the wavelength of the frequency signals, and wherein the one end of the coupling is directly coupled to the first transmission line; and the other end of the coupling is directly coupled to the second transmission line.

11. The circuit as defined by the claim 1, wherein a length of the first transmission line and a length of the second transmission line are each larger than 5% of the wavelength of the frequency signals, and wherein a difference between the first line width and the second coupling width is smaller than a difference between the first line width and the second line width, and a difference between the second line width and the first coupling width is smaller than the difference between the first line width and the second line width.

12. The circuit as defined by the claim 1, wherein a length of the first transmission line and a length of the second transmission line are each larger than 5% of the wavelength of the frequency signals, and wherein a difference between the first line width and the second coupling width is smaller than a difference between the first line width and the second line width, and a difference between the second line width and the first coupling width is smaller than the difference between the first line width and the second line width, and wherein the length of the coupling is smaller than 10% of a wavelength of the frequency signals.

13. The circuit as defined by the claim 1, wherein a length of the first transmission line and a length of the second transmission line are each larger than 5% of the wavelength of the frequency signals, and wherein a difference between the first line width and the second coupling width is smaller than a difference between the first line width and the second line width, and a difference between the second line width and the first coupling width is smaller than the difference between the first line width and the second line width, and wherein the length of the coupling is smaller than 10% of a wavelength of the frequency signals, and wherein the coupling includes a first block taper having the first coupling width at the one end of the coupling, and a second block taper having the second coupling width at the other end of the coupling, the first block taper is directly coupled to the second block taper, and the coupling is configured to reduce signal reflection between the transmission lines by multiple dB in comparison to the first transmission line being directly coupled to the second transmission line.

14. The circuit as defined by the claim 1, the first transmission line and the coupling and the second transmission line forming a serial arrangement for guiding frequency signals.

15. The circuit as defined by the claim 14, a length of the coupling being smaller than a wavelength of the frequency signals.

16. The circuit as defined by the claim 14, a length of the first transmission line and a length of the second transmission line being larger than 5% of the wavelength of the frequency signals.

17. A circuit comprising:
a first transmission line with a first line width;
a second transmission line with a second line width; and
a coupling with a first coupling width at one end and with a second coupling width at the other end, the one end being coupled to the first transmission line and the other end being coupled to the second transmission line, which first line width is smaller than the second line width, which first coupling width is larger than the first line width and which second coupling width is smaller than the second line width, the one end having a first taper with the first coupling width, and the other end having a second taper with the second coupling width, the second taper being coupled to the first taper, the first taper and the second taper forming a serial arrangement for guiding frequency signals.

18. The circuit as defined by the claim 17, a length of the first taper or a length of the second taper being 40-60% of a length of the coupling or a combination thereof.

19. The circuit as defined by the claim 17, a length of the first taper or a length of the second taper being 50% of a length of the coupling or a combination thereof.

20. A method for coupling a first transmission line with a first line width and a second transmission line with a second line width, which method comprises:
a first step of coupling one end of a coupling to the first transmission line, the coupling having a first taper with a first coupling width at one end of the coupling; and
a second step of coupling the other end of the coupling to the second transmission line, the coupling having a second taper with a second coupling width at the other end of the coupling, which first line width is smaller than the second line width, which first coupling width is larger than the first line width and which second coupling width is smaller than the second line width.

\* \* \* \* \*